US008143971B2

(12) United States Patent
Beek et al.

(10) Patent No.: US 8,143,971 B2
(45) Date of Patent: Mar. 27, 2012

(54) MEMS RESONATOR

(75) Inventors: Jozef Thomas Beek, Rosmalem (NL); Johannes van Wingerden, Hardinxveld-Giessendam (NL); Wim van den Einden, Deukne (NL); Kim Phan Le, Eindheven (NL); Gerhard Koops, Aalst (BE); Cas van der Avoort, Waalre (NL)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 237 days.

(21) Appl. No.: 12/501,272

(22) Filed: Jul. 10, 2009

(65) Prior Publication Data

US 2010/0026421 A1 Feb. 4, 2010

(30) Foreign Application Priority Data

Jul. 11, 2008 (EP) ................................. 08104596.5

(51) Int. Cl.
*H03H 9/02* (2006.01)
*H01L 21/00* (2006.01)

(52) U.S. Cl. .......................... 333/186; 333/197; 438/50

(58) Field of Classification Search .................. 333/186, 333/197, 200; 438/54, 55, 50
See application file for complete search history.

(56) References Cited

U.S. PATENT DOCUMENTS 7,002,436 B2 * 2/2006 Ma et al. ....................... 333/186
7,068,125 B2 * 6/2006 Lutz et al. ..................... 333/186

OTHER PUBLICATIONS

Jeong et al., Evaluation of Elastic Properties and Temperature Effects in Si Thin Films Using Electrostatic Microresonator, Journal of Microelectromechanical Systems, vol. 12 No. 4, 2003.*

* cited by examiner

*Primary Examiner* — Dean O Takaoka
(74) *Attorney, Agent, or Firm* — Haynes and Boone, LLP

(57) ABSTRACT

A MEMS resonator, comprising a planar resonator body formed of two different materials with opposite sign temperature coefficient of Young's modulus. A first portion of one material extends across the full thickness of the resonator body. This provides a design which allows reduced temperature drift.

10 Claims, 6 Drawing Sheets

| diagram | free ends | inside | $x_{opt}$ | α | freq1. | freq2. |
|---|---|---|---|---|---|---|
|  | Si | Ox | 0.3 | 1.2 | 0.93 $f_{Si}$ | 2.8 $f_{Si}$ |
|  | Ox | Si | 0.4 | 0.2 | 0.84 $f_{Si}$ | 2.5 $f_{Si}$ |
|  | Si | Si | — | 1 | 1 $f_{Si}$ | 3.0 $f_{Si}$ |

| diagram | left | right | $x_{opt}$ | α |
|---|---|---|---|---|
|  | Si | Ox | 0.75 | 1.1 |
|  | Si | Ox | 0.6 | 0.4 |

MEMS RESONATOR

CROSS REFERENCE

This application claims priority to European patent application number 08104596.5, filed Jul. 11, 2008, the disclosure of which is incorporated herein by reference.

BACKGROUND

This invention relates to MEMS resonators.

MEMS resonators are used in reference oscillators in RF receiver circuits. The resonance frequency of a MEMS resonator in silicon exhibits a temperature drift of typically −30 ppm/K. For some applications this drift needs to be reduced significantly. For example, when using a MEMS resonator in a GSM reference oscillator the drift needs to be below +/−20 ppm or even +/−10 ppm over a temperature range of 100K.

This can be achieved by keeping the resonator at a constant temperature by placing the resonator in a temperature controlled feedback loop. In this case, the temperature is measured on, or in close vicinity of the resonator. This temperature is then stabilized by heating the resonator to a preset temperature.

An alternative approach is to design the resonator to reduce the dependency of the frequency on temperature. One approach is to combine mono-crystalline silicon with amorphous $SiO_2$, since the Young's modulus of $SiO_2$ exhibits an opposite temperature dependency to that of silicon.

The most straightforward way of combining Si and $SiO_2$ into one resonating body is to grow a layer of oxide on the surface of the Si by means of thermal oxidation.

A schematic process flow is depicted in FIG. 1.

The process starts with a Silicon-on-Insulator (SOI) wafer, comprising a monocrystalline silicon substrate 10, $SiO_2$ layer 12 and silicon layer 14 as shown in FIG. 1A.

The top silicon layer is then patterned as shown in FIG. 1B, followed by an isotropic sacrificial layer etch of the $SiO_2$ layer as shown in FIG. 1C. During the last step the freestanding Si beam 16 element is oxidized in a furnace to provide an oxidised surface layer 18 as shown in FIG. 1D.

After the silicon resonator has been released from the substrate, the exposed parts of the Si surface are covered with a layer of $SiO_2$ by this oxidation process. In order to have perfect temperature compensation, the layer thickness of the Si and $SiO_2$ layers needs to be matched to a high degree. This can be illustrated by considering a disk shaped Si resonator that is covered by layer of $SiO_2$ and is resonating in a radial direction.

The temperature drift of one-eighth of the layout of a 26 MHz disk resonator has been simulated (as a result of symmetry considerations) using finite element modelling. The disk comprises an 80 μm radius disk, with a top layer of $SiO_2$ and a bottom layer of Si. FIG. 2 shows the relative change in temperature drift, as a function of relative change in Si and $SiO_2$ thickness. The relative change in thickness can be considered to be the result of manufacturing tolerances. The scales are relative, so that they represent deviation from a desired thickness. The temperature drift is shown for the Si thickness and for the $SiO_2$ thickness as different plots.

It can be seen that a layer thickness variation smaller than around +1-0.5% (+/−0.005 on the x-axis) is required to meet the GSM specification for temperature drift of +/−0.2 ppm/K (+/−$2\times10^{-7}$ on the y-axis). However, in practice the layer thickness of both the Si and $SiO_2$ layers cannot be controlled better than +/−10% due to manufacturing tolerances. Hence the temperature drift can only be reduced by about a factor 10 compared to a non-oxidized resonator.

SUMMARY

According to an embodiment of the invention, there is provided a MEMS resonator, comprising a planar resonator body, wherein the resonator body comprises a first portion having a first Young's modulus and a first temperature coefficient of the first Young's modulus, which first portion extends across the full thickness of the resonator body, and a second portion having a second Young's modulus and a second temperature coefficient of the second Young's modulus, a sign of the second temperature coefficient being opposite to the sign of the first temperature coefficient.

The resonator of various embodiments of the invention incorporates temperature compensation through the use of different materials, as has already been proposed. However, the thickness of the two materials is exactly matched, and it has been found that thickness variations of the resonator body then have reduced effect on the temperature drift compensation. Thus, local formation of a portion extending all the way through the resonator body reduces the temperature drift of the resonator.

The first portion can comprise silicon oxide and the second portion can comprise silicon. The first portion can thus be formed by local oxidation of silicon. The first portion can for example comprise a central part of the resonator body.

The junction between the first and second portions can be at a position at which there is minimum strain in the resonator body. This enables the temperature compensation to be robust to variations in position of the junction, so that process variations do not alter the device behaviour.

The resonator can for example be designed for operation at a resonant mode for which a function of the temperature drift versus the location of the junction between the first and second positions is a local minimum, local maxima or local inflexion.

The resonator can be used in a MEMS oscillator for example as part of an integrated circuit.

Another embodiment of the invention also provides a method of forming a MEMS resonator comprising defining a planar resonator body, wherein the method comprises:

locally processing a first portion of the resonator body to define a first portion which extends across the full thickness of the resonator body, such that the resonator body comprises the first portion having a first Young's modulus and a first temperature coefficient of the first Young's modulus and a second portion having a second Young's modulus and a second temperature coefficient of the second Young's modulus, a sign of the second temperature coefficient being opposite to the sign of the first temperature coefficient.

Again, the first portion can comprise silicon oxide and the second portion comprises silicon, and the local processing then comprises local oxidation.

In one example of process, the method comprises:

patterning the silicon top layer of a silicon-on-insulator substrate to define the resonator body;

removing the insulator beneath the resonator body;

partially coating the resonator body with a mask layer, wherein the local oxidising comprises oxidising parts of the resonator body not covered by the masking layer, and the method further comprises removing the masking layer.

This method creates oxidised portion at selected areas of the resonator body, with the oxidation taking place from the top and bottom surfaces of the resonator body. The partial coating and the step of removing the insulator can be in any order, or indeed these steps may share process operations.

In another example of process, the method comprises:

partially removing the insulator layer of a silicon-on-insulator substrate which comprises a substrate, an insulator layer and a top silicon layer;

providing a mask layer on the top and bottom surfaces of the silicon layer and the top surface of the substrate;

removing portions of the silicon layer to define the resonator body with the mask layer on the top and bottom surfaces;

wherein the local oxidising comprises oxidising parts of the resonator body from the edges which are not covered by the masking layer, and the method further comprises removing the masking layer.

This method creates oxidised portion at selected areas of the resonator body, with the oxidation taking place from the edge surfaces of the resonator body.

BRIEF DESCRIPTION OF THE DRAWINGS

Examples of the invention will now be described in detail with reference to the accompanying drawings, in which.

DETAILED DESCRIPTION

The same reference numbers have been used in different figures to denote the same components and layers, and the description is not repeated.

The invention provides a MEMS resonator in which a first treated portion of the resonator body extends across the full thickness of the resonator body.

The invention is based on the recognition that the thickness of a $SiO_2$ layer can be linked to thickness of the Si layer when oxidizing the full thickness of the Si layer. In this way, variations in the Si layer thickness will result in correlated variations in the $SiO_2$ layer thickness. In order to have zero overall temperature drift, the $SiO_2$ formation is carried out only on selected parts of the resonator.

The layer thickness variations within the MEMS resonator are much smaller than +/−10%, since the MEMS resonator typically measures only 0.1 mm in diameter and the thickness variations varies gradually over the wafer. For a wafer measuring 100 mm in diameter this translates to only 0.01% layer thickness variation within the area of a MEMS resonator.

By linking the thickness of the Si layer directly with variations in the $SiO_2$ layer, a very small overall temperature drift can be obtained. This can be illustrated by considering a 26 MHz disk shaped Si resonator of which the central section has been fully oxidized.

Figure 2:
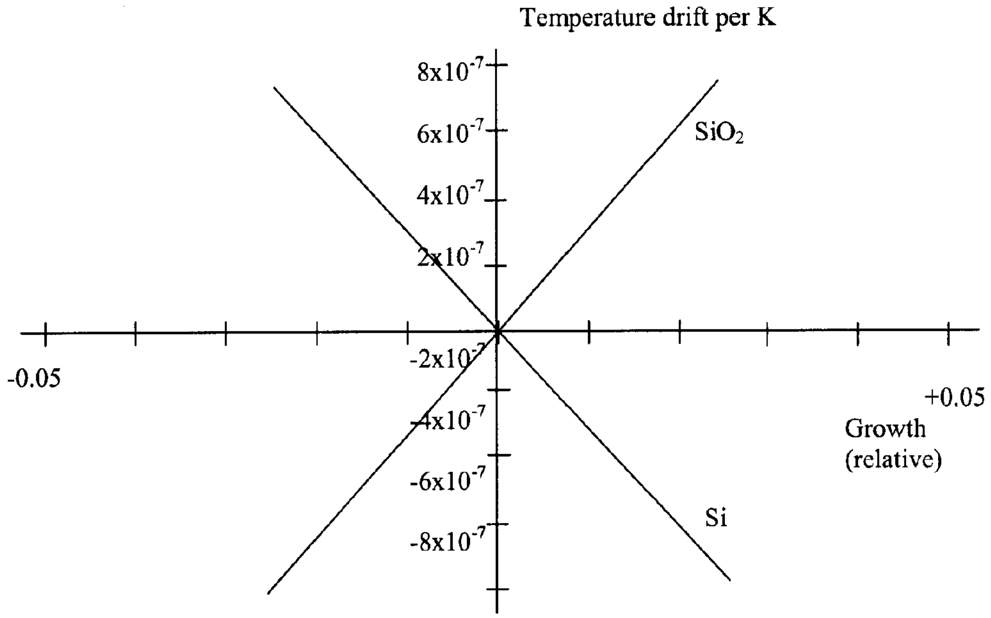
FIG. 2 shows the result of modelling a structure similar to that shown in FIG. 1.
Figure 3:
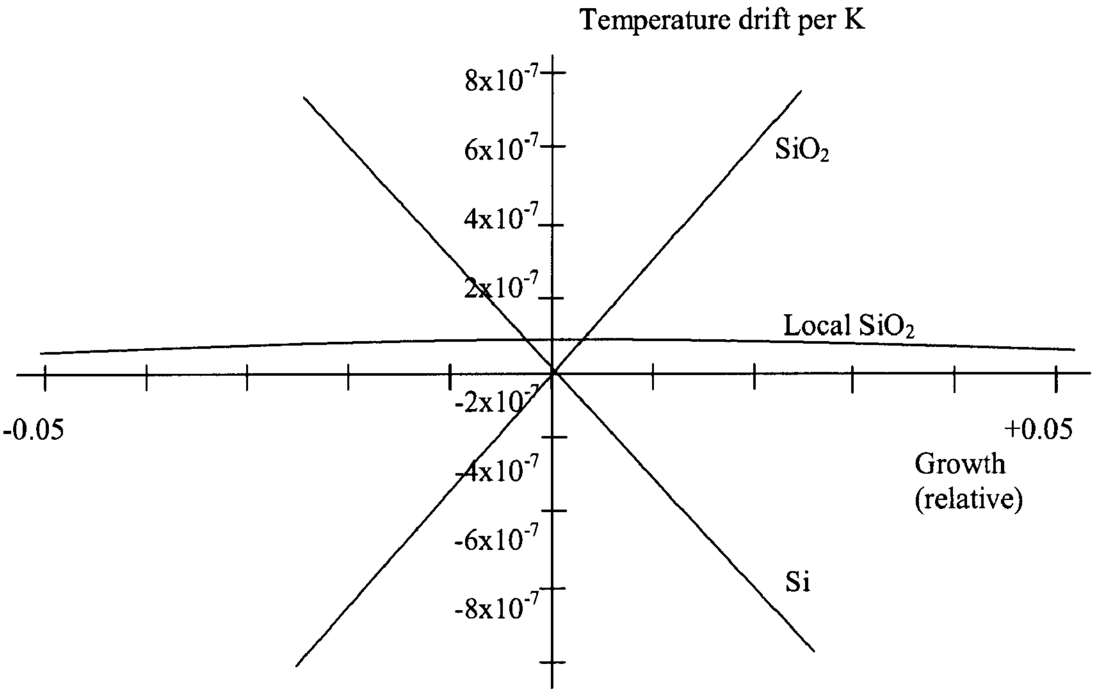
FIG. 3 shows the result of modelling a structure of the invention.

The temperature drift of one-eighth of the layout is simulated using finite element modelling and FIG. 3 shows the relative change in temperature drift as a function of relative change in Si thickness. Thus, FIG. 3 corresponds to FIG. 2 and includes the same plots, but additionally shows the characteristics of an example of resonator in accordance with the invention ("Local $SiO_2$"). The modelled example comprises a disk resonator with radius 96 μm and oxidised circular central section with radius 38 μm.

It can be seen that the variation of thickness of several percent results in a variation of temperature drift of much less than 0.2 ppm/K, since the thickness of the $SiO_2$ is now linked to the thickness of the Si layer. The non-correlated variations in thickness of the Si layer and $SiO_2$ layer are limited to about 0.01% as a result of Si thickness variations within one resonator.

This variation also leads to a temperature drift of much less than 0.2 ppm/K.

The compensation of temperature drift using a composite resonator in which materials with opposite temperature drift is known and has also been demonstrated in combination with materials other than Si.

For example, the same principle has been demonstrated for Bulk-Acoustic-Wave (BAW) resonators using a combination of AlN and $SiO_2$. The invention can thus be applied to devices which do not combine Si and $SiO_2$. The temperature drift compensation can more generally be obtained providing (at least) two materials; one having a first Young's modulus and a first temperature coefficient of the first Young's modulus, and the other having a second Young's modulus and a second temperature coefficient of the second Young's modulus, a sign of the second temperature coefficients being opposite.

For a silicon resonator, the full transformation of a Si layer into a $SiO_2$ layer on predefined parts of the resonator, as provided by this invention, provides a greatly improved control over the temperature dependency of the resonator.

The transformation can be achieved using techniques which chemically transform Si into $SiO_2$, such as thermal oxidation or anodization. In this way, thickness variations in the Si layer can be correlated to variations in the $SiO_2$ layer. This leads to a very good control over the value of the absolute temperature drift, since it is insensitive to layer thickness variations.

Local oxidation of Si is a well known technique (LOCOS technology uses this technique for isolating two transistors on an IC). The same technique can be adapted for the local oxidation of Si resonators.

Figure 1:
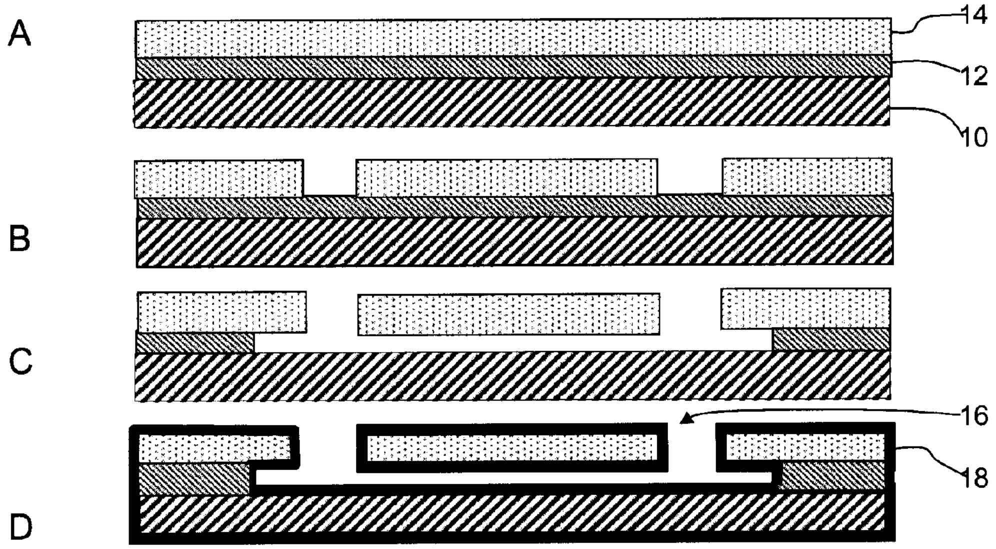
FIG. 1 shows a known process for forming a resonator using Si and $SiO_2$ to provide temperature drift compensation.
Figure 4:
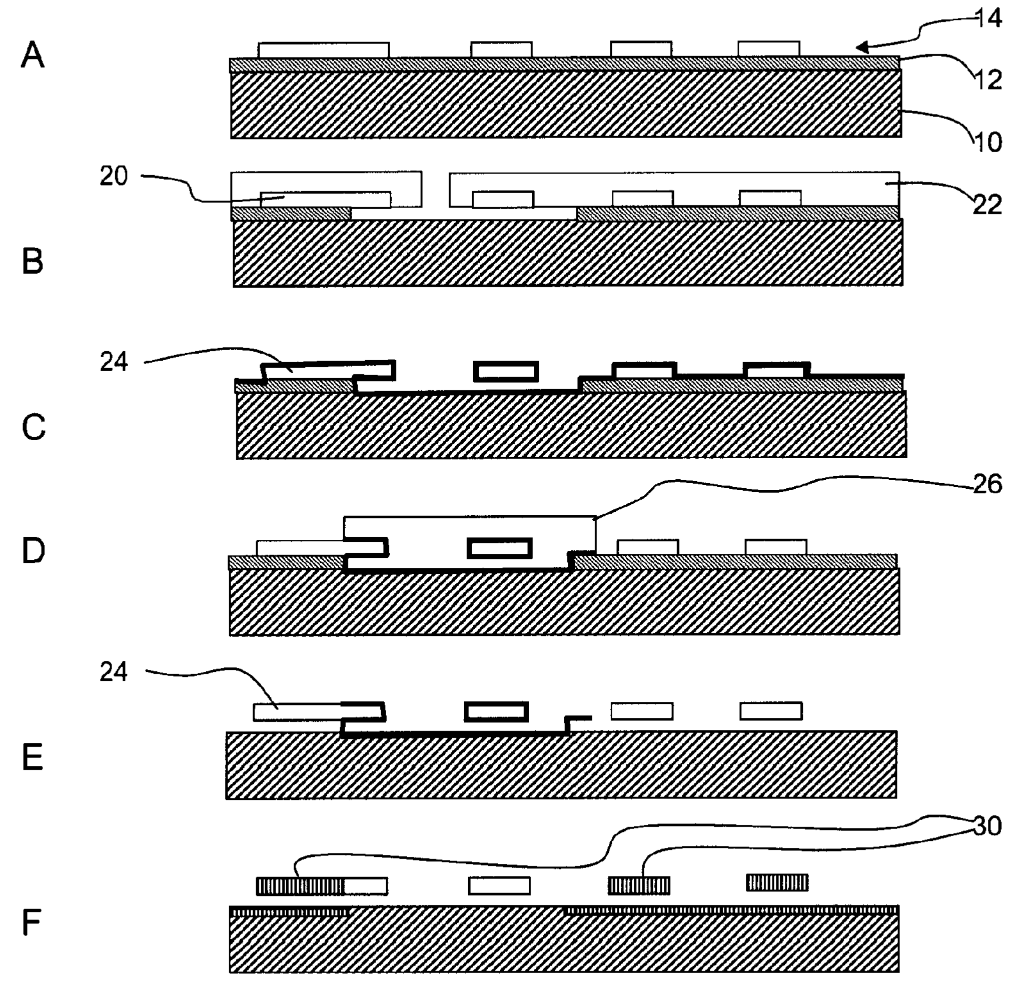
FIG. 4 shows a first process to form a structure in accordance with the invention.

FIG. 4 shows a first example of process, which starts with a SOI substrate as shown in FIG. 1A, and patterned as shown in FIG. 1B. Thus, FIG. 4A corresponds to FIG. 1B.

FIG. 4 is used to show how the process can be used to form islands which are completely $SiO_2$, completely Si or a mixture in accordance with the invention.

To form a resonator which combines $SiO_2$ and Si, the resonator mass is only partly released from the substrate by the sacrificial etch process shown in FIG. 4B. The area 20 defines the resonator body which is partially released. The sacrificial etch comprises a HF vapour etch through openings defined in a resist layer 22 by a lithography process.

After removal of the resist layer 22, the resulting structure is covered with a masking layer 24 of $Si_3N_4$ by a LPCVD process, as shown in FIG. 4C.

A second release etch process uses a second resist layer 26 shown in FIG. 4D and which is patterned to cover parts of the silicon nitride layer 24. The lithographically patterned resist layer 26 is used to etch away the exposed nitride layer as also shown in FIG. 4D. This results in only partial coating of the resonator body with a mask layer.

After removal of the resist layer 26, a further HF vapour etch process removes more of the insulator layer 12, in particular so that the resonator mass is fully released as shown in FIG. 4E.

The structure is then oxidized, and the $Si_3N_4$ layer shields part of the resonator body from this oxidation. This provides a local oxidising of parts of the resonator body not covered by the masking layer.

The silicon nitride masking layer is then removed to give the structure shown in FIG. 4F. The oxidised areas are shown as 30.

As shown, the released portions of the layer 14 can be fully oxidised, partially oxidised (as for the resonator mass 24) or fully Si.

In this process, a thin $Si_3N_4$ layer is used to cover all parts of the Si resonator that will not be converted into $SiO_2$. Parts that are not covered by the $Si_3N_4$ are then oxidized for example by exposing the sample to high temperatures in an ambient atmosphere containing oxygen. After this oxidation, the $Si_3N_4$ layer is removed and a locally oxidized MEMS resonator is defined.

Figure 5:
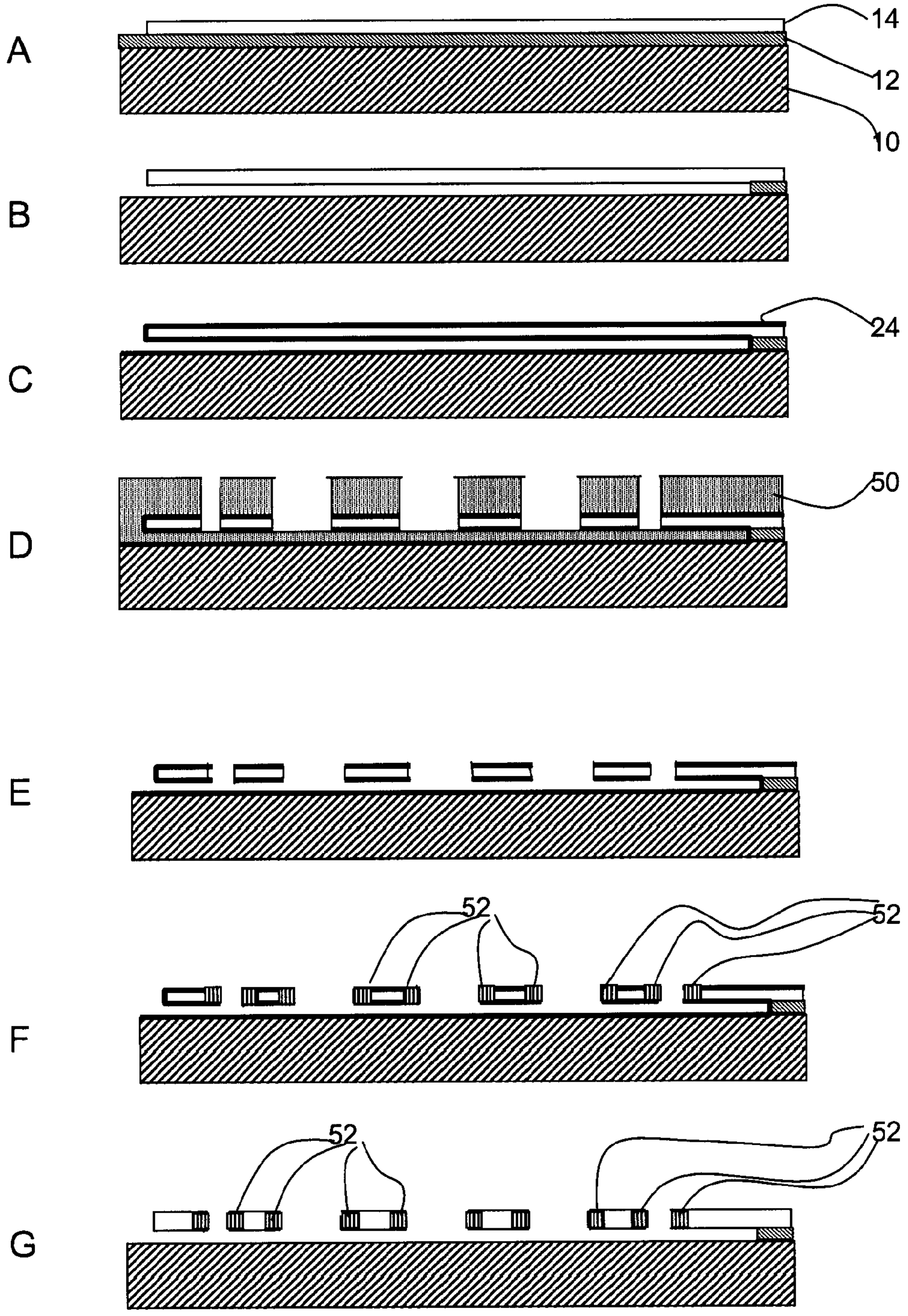
FIG. 5 shows a second process to form a structure in accordance with the invention.

FIG. 5 shows a second example of process, which also starts with a SOI substrate as shown in FIG. 1A. Thus, FIG. 5A corresponds to FIG. 1A.

The top silicon layer is patterned and released as shown in FIG. 5B, followed by the $Si_3N_4$ deposition shown in FIG. 5C resulting in the masking layer 24. This provides a mask layer on the top and bottom surfaces of the silicon layer, as well as on the top surface of the substrate 10.

Next, a second pattern is etched into the top silicon layer 14 using a resist layer 50. The etching is through the $Si_3N_4$—Si—$Si_3N_4$ stack formed of the silicon nitride layer on top of the silicon layer, the silicon layer itself, and the silicon nitride layer on the bottom of the silicon layer. The resulting structure is shown in FIG. 5D. This has isolated portions of the silicon layer, and one or more of these define a resonator body, which still has the mask layer 24 on the top and bottom surfaces.

The resist layer is removed as shown in FIG. 5E, and the structure is then oxidized as shown in FIG. 5F. The oxidation is in a lateral direction so that parts of the resonator body are oxidised from the edges which are not covered by the masking layer 24.

The $Si_3N_4$ masking layer is then removed to result in the structure shown in FIG. 5G. The oxidised regions are shown as 52.

There are two examples of possible process, starting from a SOI substrate. However, various alternative processes are also possible.

The invention provides a resonator structure in which part of the resonator is formed from one material (silicon in the example given) and another part is formed from a material with different Young's modulus and a temperature coefficient of the second Young's modulus (silicon oxide in the example given). The location of the boundary between the two materials is key to the correct temperature compensation.

In order to show how the position of the boundary between the materials can be chosen, one-dimensional resonators will be considered in the analysis below. The analysis for two dimensional resonators such as disks or squares that either operate in an extensional or higher-order mode of vibration are not considered here, although these will show the same advantageous two-material property as the one-dimensional resonators.

The fundamental point is the placement of material junctions on locations of minimum strain (these are not the 'nodes' in a vibrating body, since these are the points of zero movement).

Two essentially different resonators are discussed below.

The first is a resonator that vibrates in an elongation way (extensional mode, or bulkmode). The second exhibits a bending vibration. Both show a temperature coefficient (TC) of zero that is invariant with respect to small deviations from the specified dimensions thereby giving robust temperature compensation. The bending resonator can also be designed to give a nearly fixed resonance frequency, whereas the elongational resonator has a resonance frequency that still is dependent on variations in the specified geometry.

Extensional Mode Resonator (Also Referred to as "Bulk-Mode")

This device can provide the robust temperature compensation when operated in an overtone. Moreover, due to the addition of silicon dioxide, which is a less stiff material, all frequencies of the composite resonator will be lower than those of the silicon-only resonator. Therefore, the operational frequency of the composite resonator and intended overtone as compared to the frequency of a purely silicon resonator in the same overtone are specified in the analysis below.

Figure 6:
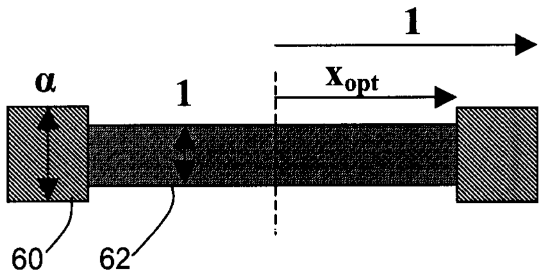
FIG. 6 shows a first resonator beam design used to explain how the position of the junction between materials can be selected.

FIG. 6 shows the device in schematic form. The resonator is free-standing, and is attached to the outside world at locations near the dotted centreline. The resonator is assumed to have a uniform thickness all along the resonator. The assumption of uniform thickness is in accordance with the manufacturing method, as explained above. In particular, the resonators are created in the silicon layer of a SOI wafer. The oxide layer can be formed from the silicon layer as explained above, or it can be created by excavating the SOI layer and filling it with oxide. A planarization step afterwards then ensures equal thicknesses of the oxide and silicon parts of the resonator in accordance with the invention.

The general design of FIG. 6 has ends 60 of one material and a central section 62 of another material. The end sections have a width $\alpha$ relative to the width (shown as 1) of the central section. The boundary between the central section and the end section is at a distance $X_{opt}$ from the centre line, with the total length from the centre line normalised to 1.

Thus, the model of the one dimensional structure takes into account:

- the materials for the free-ends and the other part of the resonator;
- the location of the junction ($x_{opt}$) measured relatively (i.e. compared to a normalized length) as the distance from the anchor to the junction divided by the distance from the anchor to one free end;
- the necessary relative width of the outer part (a) compared to the normalized width of the inner part.

Figure 7:
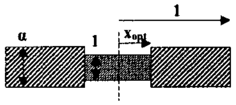
FIG. 7 is a table showing preferred junction positions for the design of FIG. 6.
Figure 7:
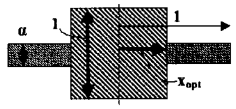
Figure 7:
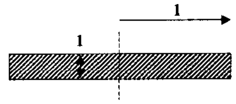

The table in FIG. 7 shows optimal configurations. The first row in the table is for an oxidised central section. The second row in the table is for oxidised end sections, and the third row in the table is for a silicon resonator, for comparison.

Thus, it can be seen that for a bulk-mode bar resonator, with an oxidised central portion, the oxidised part occupies 30% of the length of the bar—more generally between 20% and 40%, or preferably between 25% and 35%. The central oxidised section is narrower than the ends, for example 83% of the width of the ends—more generally between 75% and 95%.

The frequencies of the optimal designs can be compared to the frequency of the regular silicon resonator in row 3. Comparison of the operational frequency of a device to its characteristic dimensions reveals the usage of overtones.

The frequency freq1 in the table is the fundamental mode frequency, and the frequency freq2 is the first overtone. For a silicon-only resonator, the first overtone has a frequency of 3.0 times the fundamental frequency, found by Equation 1 below. The composite resonators have a frequency that is always lower than 3 times this frequency. The silicon-only resonator is included for reference to the absolute frequency. The silicon-only resonator does not have the property of a zero temperature coefficient.

Equation 1 below shows the bulkmode fundamental resonance ($f_1$) and first overtone ($f_2$), based on length L and material parameters E and ρ, being Young's modulus of elasticity and mass density, respectively:

$$f_1 = \frac{1}{2\pi}\frac{\pi}{2L}\sqrt{\frac{E}{\rho}} \text{ and } f_2 = \frac{1}{2\pi}\frac{3\pi}{2L}\sqrt{\frac{E}{\rho}} \quad \text{Eq. 1}$$

For a one-material resonator of constant cross-section, the thickness of the resonator, as well as the width do not play a role in determining the frequencies of either fundamental or first overtone.

Bending Bar Resonator

Unlike extensional resonators, a bending bar resonator already has the robust temperature coefficient near zero for the fundamental mode of vibration.

FIG. 8 shows the device in schematic form.

Figure 8A:
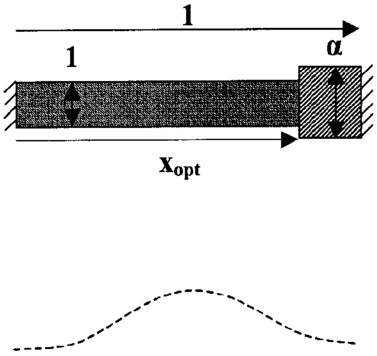
FIGS. 8A and 8B show second resonator beam designs used to explain how the position of the junction between materials can be selected.
Figure 8B:
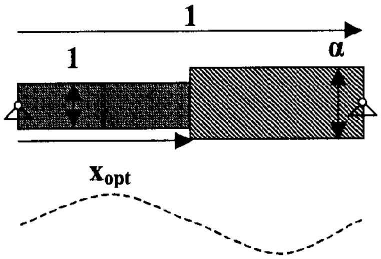

FIG. 8A shows an arrangement with the ends clamped, and FIG. 8B shows an arrangement with the ends hinged. Clamping is boundary condition that restricts both the displacement and angle to zero at the ends, whereas hinging in is a boundary condition that only restricts the displacement to zero.

The analysis again assumes that the resonator is free-standing, and that it is attached to the outside world at the outer ends in a clamped-clamped manner for the fundamental mode (FIG. 8A) or is attached to the outside world at the outer ends in a hinged-hinged manner for the higher-order mode (FIG. 8B). The resonator is again assumed to have a uniform thickness all along the resonator.

Figure 9:
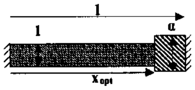
FIG. 9 is a table showing preferred junction positions for the designs of FIG. 8.
Figure 9:
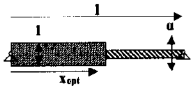

The table in FIG. 9 shows optimal configurations. The first row in the table is for a clamped-clamped mode and the second row in the table is for a hinged-hinged mode.

Thus, it can be seen that for a bending bar resonator, there are two basic designs.

For a clamped arrangement, with an oxidised end portion, the oxidised part preferably occupies 25% of the length of the bar—more generally between 15% and 35%, or preferably between 20% and 30%. The oxidised section is wider, for example 10% wider—more generally between 5% and 15% wider.

For a hinged arrangement, with an oxidised end portion, the oxidised part preferably occupies 40% of the length of the bar—more generally between 30% and 50%, or preferably between 35% and 45%. The oxidised section is narrower, for example 40% as wide—more generally between 35% and 45% as wide.

Possible implementations include the two ways of suspension (clamping or hinging), the usage of the fundamental mode or the overtone and the possibilities to use more than one basic bar together in one structure. Combining two or four bars together allows for anchoring (fixation to outside world) at nodal points, leading to high Q-factors when operated.

For example, two composite beams can be connected, with by 90 degree angle at the junction within the beam (at the point $X_{opt}$) and 90 degree connections between the two beams. This makes a rectangle out of the two composite beams. The corner points will rotate but can still function as anchor points, leaving the entire structure suspended. Four straight composite beams can also be combined to make a rectangle.

The problem of generating a drift-free resonator (for temperature variations) can be reduced to finding the appropriate balance in a resonator of parts made of silicon dioxide (temperature coefficient approximately +86 ppm per K) with respect to parts made of silicon (temperature coefficient approximately −30 ppm per K). The problem consists in finding the zero-crossing of a function showing the drift versus the mass balance of the two materials. As mentioned above, the optimum junctions between the two materials can be found based on a mathematical analysis of where the minimum strain arises.

This point of minimum strain is a part of the modeshape, while the modeshape itself depends on the placement of the junction and the relative widths of the two materials.

A location of zero drift (drift smaller than 0.2 ppm per K) can be found, but for a monotonically increasing function, this location is very narrow.

The selection of mode of operation, and junction at the location of lowest strain enables locations of zero drift to be found (drift smaller than 0.2 ppm per K), and for which the drift versus mass balance function is not a linear increasing function, but a parabola. The minimum of the parabola can be tuned to a desired location. For small excursions around the optimum mass balance, the drift remains close to zero. Thus, the optimum in this case is a robust optimum, as compared to the optimum found for a fixed-slope zero crossing.

The robustness arises from the fact that the material interface lies at a point that locally has zero potential energy. These points are inflection points, arising for higher order modes in all possible ways of clamping, for bending resonators.

For a clamped-clamped arrangement, the desired relationship holds for the fundamental mode of vibration. For other suspension types, modes of higher order than the fundamental mode have to be used.

Figure 10:
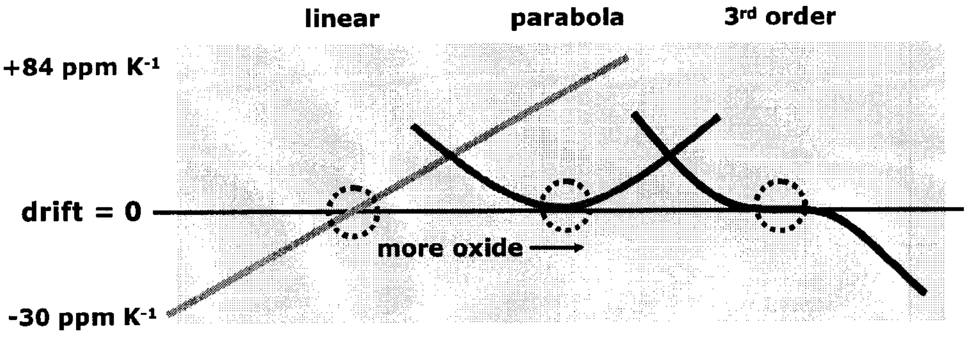
FIG. 10 is used to explain the general design approach for selecting the junction location between different materials.

FIG. 10 shows the drift versus oxidation (in terms of the fraction of the length which is oxidised). The curve in FIG. 10 depends on the junction position and the relative widths, as indicated above. Operating a clamped-clamped beam resonator with silicon dioxide as material on one end, results in a drift behaviour that locally resembles either a parabola or a $3^{rd}$ order function, of which the horizontal part can be tuned to zero. In the case of a bulk resonator, the linear relationship in FIG. 10 corresponds to the fundamental mode. The device is instead tuned to a higher order mode, again giving the parabolic or $3^{rd}$ order curves.

In particular for a beam resonator operated in bending mode (as explained with reference to FIGS. 8 and 9), operation around the parabola means that the drift and absolute frequency will locally be nearly independent of oxide boundary location. This means the device will have a robust absolute frequency. This is because the robustness of the absolute frequency of the fundamental bending mode occurs with the same beam design (i.e. location of the material boundary) as the robustness for temperature coefficient. For a clamped arrangement, two inflexion points occur for the fundamental mode.

The advantage of placing the location of the material junction using the analysis above is the robustness to process variations. For conventional solutions, the tolerance on oxidation is much tighter than achievable (even in a lab), to arrive at zero drift. The approach outlined above enables the required tolerance to be achieved easily.

Additionally, a robust absolute frequency for slight changes in the amount of oxidation can be achieved.

As shown in FIG. 9, the bending mode resonator requires only limited oxidation, leaving the resonator electrically accessible. In a practical design, combining two of the intended bending resonators, deformation or stresses caused by the oxidation of part of the resonator can be reduced. The absolute frequency can be predicted very well from design; inaccuracy in the oxidation process does not change the resonance frequency more than other production parameters. The positioning of the interface between silicon and silicon dioxide at a stress-free zone limits the chance of failure at this interface.

The individual process steps used in the method of the invention are all conventional, and for this reason have not been described in detail. Indeed, the conversion of silicon to silicon oxide is a routine process used in IC manufacture.

Various modifications will be apparent to those skilled in the art.

The invention claimed is:

1. A method of forming a MEMS resonator comprising defining a planar resonator body, wherein the method comprises:

partially coating the resonator body with a mask layer;

locally oxidising a first portion of the resonator body to define a first portion which extends across a full thickness of the resonator body, such that the resonator body comprises the first portion having a first Young's modulus and a first temperature coefficient of the first Young's modulus and a second portion having a second Young's modulus and a second temperature coefficient of the second Young's modulus, a sign of the second temperature coefficient being opposite to a sign of the first temperature coefficient, wherein locally oxidising comprises oxidising parts of the resonator body not covered by the masking layer.

2. The method as claimed in claim 1, wherein the first portion comprises a central part of the resonator body.

3. The method as claimed in claim 1, comprising selecting a junction between the first and second portions at a position for which a resonant frequency has lowest sensitivity to deviations in the junction position.

4. The method as claimed in claim 1, comprising selecting a junction between the first and second portions at a position at which there is minimum strain in the resonator body.

5. The method as claimed in claim 1 further comprising:

implementing the MEMS resonator in an integrated circuit.

6. The method as claimed in claim 1, wherein the first portion comprises silicon oxide and the second portion comprises silicon.

7. The method as claimed in claim 6, comprising:

patterning a silicon top layer of a silicon-on-insulator substrate to define the resonator body;

removing an insulator beneath the resonator body; and removing the masking layer.

8. The method as claimed in claim 6, comprising:

partially removing an insulator layer of a silicon-on-insulator substrate which comprises a substrate, the insulator layer and a top silicon layer;

providing a mask layer on top and bottom surfaces of the silicon layer and a top surface of the substrate;

removing portions of the silicon layer to define the resonator body with the mask layer on the top and bottom surfaces; and removing the masking layer.

9. The method as claimed in claim 7, wherein the mask layer comprises silicon nitride.

10. The method as claimed in claim 8, wherein the mask layer comprises silicon nitride.

* * * * *